US005635927A

United States Patent [19]

Lin

[11] Patent Number: 5,635,927

[45] Date of Patent: Jun. 3, 1997

[54] MAGNIFYING KEY SWITCH

[75] Inventor: James Lin, Taipei, Taiwan

[73] Assignee: Silitek Corporation, Taipei, Taiwan

[21] Appl. No.: 556,264

[22] Filed: Nov. 13, 1995

Related U.S. Application Data

[63] Continuation-in-part of Ser. No. 229,784, Apr. 19, 1994, abandoned.

[51] Int. Cl.[6] .................................................... H03K 17/94

[52] U.S. Cl. ............................... 341/22; 341/20; 200/311; 200/314; 200/341

[58] Field of Search ......................... 341/20–22; 345/170; 200/308, 309, 311, 314, 341, 345, 512, 514; 364/189, 190, 709.1, 709.11, 709.12

[56] References Cited

U.S. PATENT DOCUMENTS 4,464,326 8/1984 Nishihara ................................ 264/246

4,937,408 6/1990 Hattori et al. .......................... 200/314

*Primary Examiner*—Jeffery Hofsass

*Assistant Examiner*—Ashok Mannava

*Attorney, Agent, or Firm*—Browdy and Neimark

[57] ABSTRACT

A key switch includes a rubber key body mounted within a key switch hole on a key pad device above a circuit board thereof, and a key cap fastened to the rubber key body at the top and depressed to move the rubber key body downward in triggering a contact on the circuit board, wherein the key cap is made from a plastic convex lens having a convex top wall and a plain bottom wall, the plain bottom wall having a light-blocking area and a light-penetrable area, the light-penetrable area being shown in the form of a pattern; the rubber key body is molded from a vulcanized rubber sealed to the plain bottom wall of the key cap through a heat sealing process. Three layers of ink are disposed between the key body and the key cap.

13 Claims, 4 Drawing Sheets

MAGNIFYING KEY SWITCH

CROSS-REFERENCE TO RELATED APPLICATION

This is a continuation-in-part of application Ser. No. 08/229,784, filed Apr. 19, 1994, now abandoned, the contents of which are incorporated by reference.

FIELD OF THE INVENTION

The present invention relates to key switches, and more particularly to a key switch having its key cap made from a convex lens for showing its identification pattern in an enlarged scale.

BACKGROUND OF THE INVENTION

Regular electric and electronic apparatus are commonly operated through a keyboard or key pad device. The keyboard or key pad device on a mobile telephone, notebook computer, etc., is compact, and therefore the keys are arranged close to one another. For the aged, it is difficult to distinguish the patterns or numerals on the keyboard or key pad of a small electric or electronic apparatus.

Furthermore, FIG. 6, labeled "prior art", shows a key switch D for a key pad device according to the prior art, comprised of a unitary plastic key body and a conductive rubber pad fastened to the plastic key body for triggering the circuit board below.

Because the melting point of the plastic key body is about 120° C. and the rubber is either vulcanized and therefore non-fusible or, if thermoplastic, has a melting point of about 170° to 180° C., the rubber cannot be sealed to the plastic key body through any conventional heat sealing process. Therefore, a bonding agent is commonly used to fasten the rubber to the plastic key body. Because the rubber is fastened to the plastic key body by a bonding agent, the rubber may disconnect from the plastic key body after long uses.

SUMMARY OF THE INVENTION

Accordingly, the present invention has an object, among others, to overcome deficiencies in the prior art such as noted above.

The present invention eliminates the aforesaid problems. According to one aspect of the present invention, the key switch comprises a rubber key body mounted within a key switch hole on a key pad device above a circuit board thereof, and a key cap fastened to the rubber key body at the top and depressed to move the rubber key body downward in triggering a contact on the circuit board, wherein the key cap is made from a plastic convex lens having a convex top wall and a plain bottom wall, the plain bottom wall having a light-blocking area and a light-penetrable area, the light-penetrable area being shown in the form of a pattern.

According to another aspect of the present invention, the rubber key body is molded from a vulcanized rubber sealed to the ink and pigment coated plain bottom wall of the key cap through a conventional heat sealing process.

According to a third aspect of the present invention, the rubber key body is made of vulcanized rubber such that it has a melting point of approximately 120° C., which is similar to that of industrial plastics such as that used for the key cap. The similarity of melting point allows conventional heat sealing to be used for joining the key cap and the rubber key body.

According to a fourth aspect of the present invention, the light-blocking area and the light-penetrable area are formed by colored and opaque inks, which are similar in melting point and polarity to materials of the key body and key cap.

According to a fifth aspect of the present invention, three ink layers are disposed between the rubber key body and the key cap, including a translucent white ink layer, a translucent or transparent colored ink layer, and an opaque black ink layer. The white and translucent layers are preferably resistant to laser ablation; the opaque ink layer is preferably of material that is easily ablated by laser light.

BRIEF DESCRIPTION OF THE DRAWINGS

The above and other objects and the nature and advantages of the present invention will become more apparent from the following detailed description of an embodiment taken in conjunction with drawings, wherein.

DETAILED DESCRIPTION OF THE PREFERRED EMBODIMENT

Figure 1:
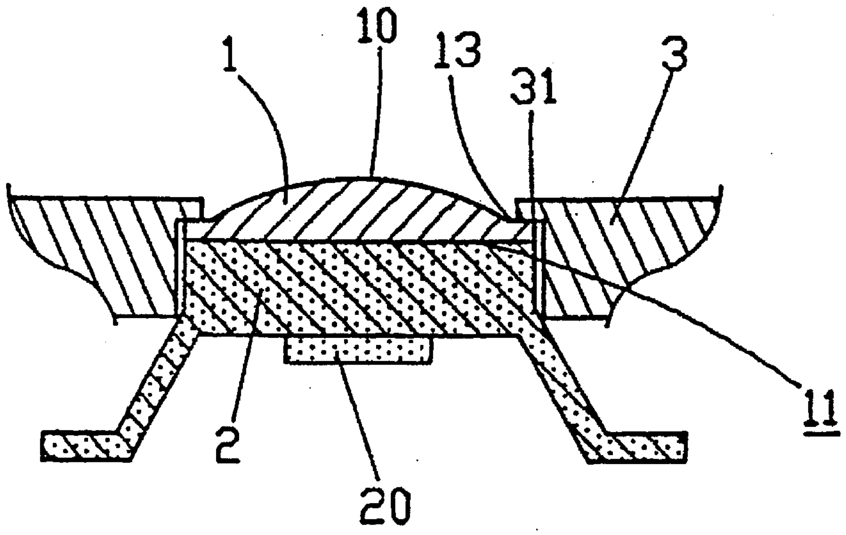
FIG. 1 is a sectional view of a key switch according the preferred embodiment of the present invention.

Referring to FIGS. 1, 2, 3, and 5, a key switch in accordance with the present invention is generally comprised of key cap 1 and a rubber key body 2. The key cap 1 is mounted on the rubber key body 2 at the top. The rubber key body 2 is molded from rubber having a melting point of about 110° to 120° C. due to vulcanization with peroxides such as 2,4-dichlorobenzoylperoxide. The rubber key body 2 has a conductive rubber 20 disposed at the bottom. When the key cap 1 is depressed, the conductive rubber 20 is moved downwards to trigger an electric contact on the circuit board below. The key cap 1 is a plano-convex lens molded from transparent plastics, having a convex top wall 10 and a plain bottom wall 11. The plain bottom wall 11 peripherally projects over the periphery of the convex top wall 10 to form a peripheral flange 13 for mounting. The key switch is mounted within a respective key switch hole on the cover shell 3 of a key pad device. When installed, the peripheral flange 13 of the key cap 1 is engaged with the horizontal top flange 31, which is disposed horizontally around the key switch hole at the top. The plain bottom wall 11 is partially covered with a layer of photo-resisting ink permitting the non-coating area to present a predetermined pattern 12.

Figure 4:
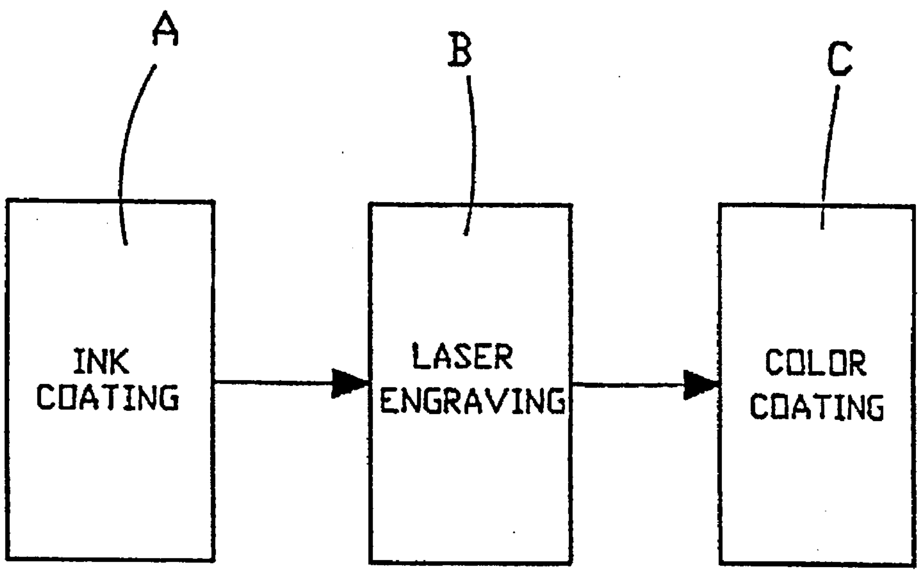
FIG. 4 is a block diagram showing the procedure of making a pattern on a key cap according to the present invention.

Referring to FIG. 4, the pattern 12 is formed on the key cap 1 by covering the plain bottom wall 11 of the key cap 1 with a layer of photo-resisting ink and removing the photo-resisting ink coating from the area for the predetermined pattern by a conventional laser engraving process, permitting light to pass therethrough.

Figure 7:
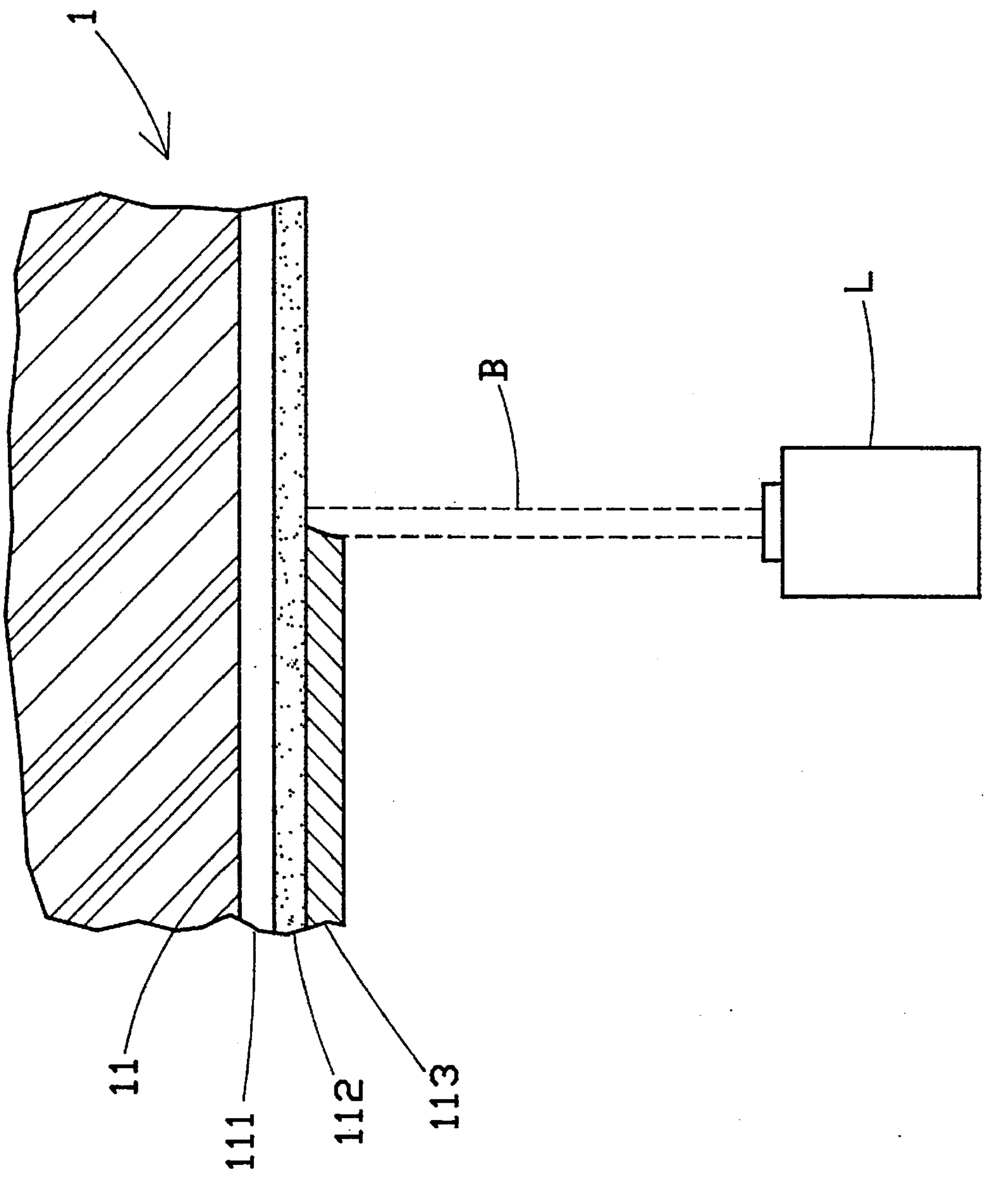
FIG. 7 is a sectional view of the key cap 1 and three ink layers, with the top most layer being ablated by a laser beam.

The conventional laser engraving process is shown schematically in FIG. 7, which also shows the three ink layers of the invention. A laser L directs a beam B onto the inner surface of the key cap 1, which is to be heat sealed to the rubber key body 2. The surface of the key cap 1 is covered with three layers of ink: a translucent white layer 111; a clear or translucent colored ink layer 112; and an outermost opaque black or dark ink layer 113. The colored layer 112 might be, for example, green, yellow, or red.

Preferably the ink layers 111, 112, and 113 are all silicone inks. The white layer 111 and the colored layer 112 include a silicone based resin material which is resistant to UV radiation due to additives which may include a combustion-resistant agent, a UV-resistant agent, an antioxidant, and/or a heat-resistant color powder. The opaque layer 113 is not resistant to laser light and is easily ablated by the beam B.

The intensity of the engraving laser beam is preferably between 140 and 170 watts. This range allows the laser beam to ablate the black or dark layer 113 but not the underlying layers.

Figure 2:
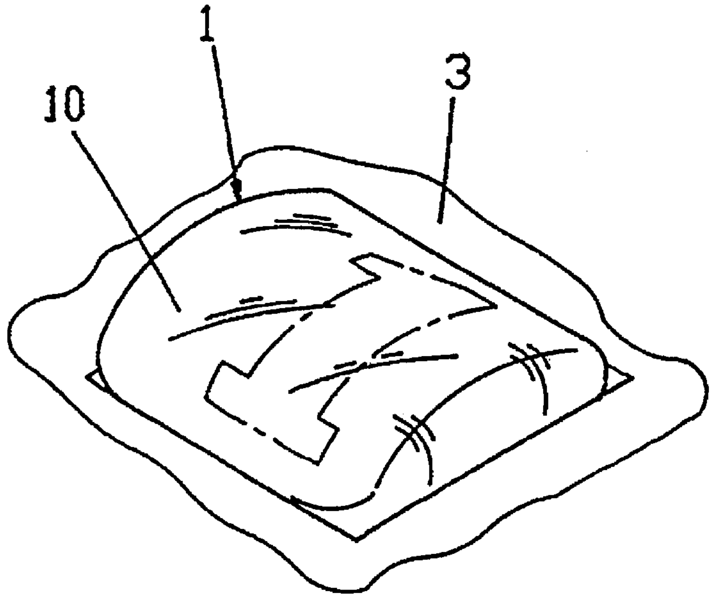
FIG. 2 is a perspective view of the key cap of the key switch shown in FIG. 1.
Figure 3:
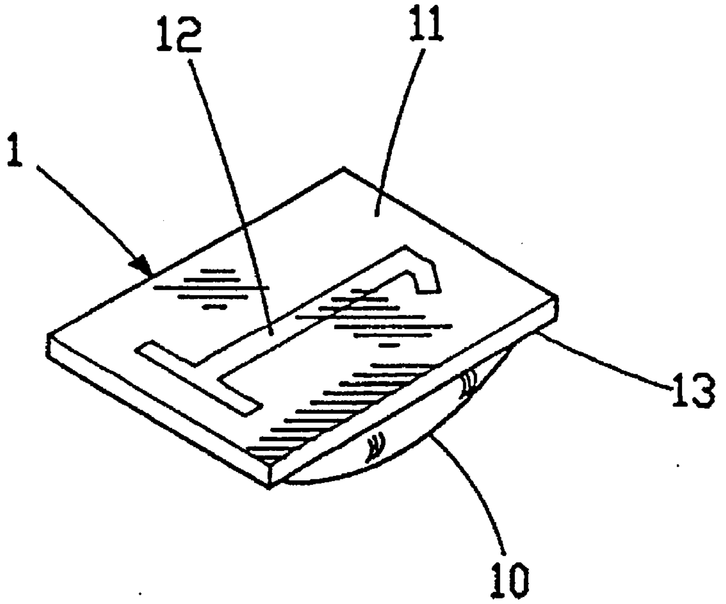
FIG. 3 is a bottom view of the key cap shown in FIG. 2.
Figure 5:
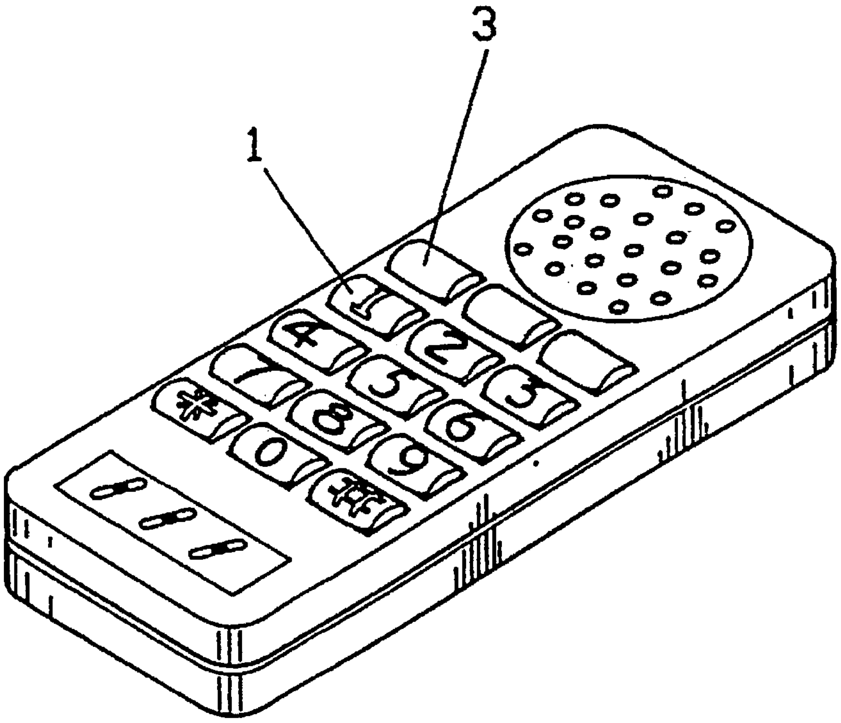
FIG. 5 is an elevational view of a key pad device according to the present invention.
Figure 6:
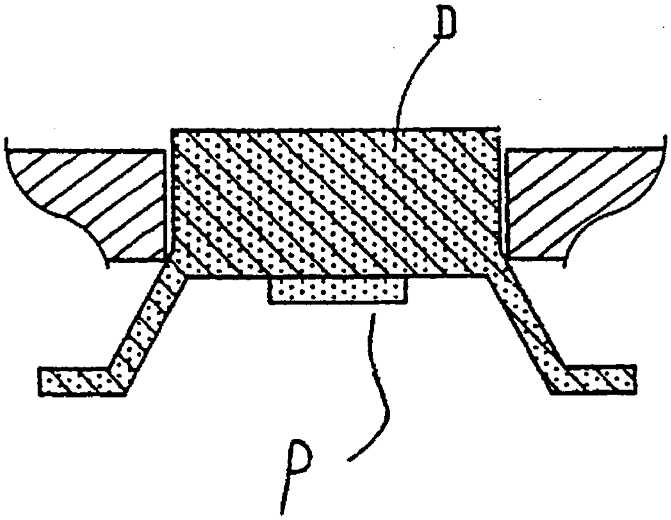
FIG. 6 is a sectional view of a key switch according to the prior art.

The key cap 1 and the three ink layers 111, 112, and 113, when subjected to conventional laser engraving processes, thereby easily form the pattern 12 of FIG. 3 (also visible in FIGS. 2 and 5). Because of the convex top wall outer surface 10, visible in FIG. 1, when one sees through the key cap 1 from the top, the pattern 12 is shown in an enlarged scale. This special design greatly helps the aged to operate the key pad device accurately.

The rubber key body 2 is molded from a rubber having a melting point of about 110° to 120° C. Therefore, the rubber key body 2 can be sealed to the ink and/or pigment coated plain bottom wall 11 of the key cap 1 through a conventional heat sealing process.

The key cap 1 is typically made from plastic material having a melting point of about 120° C. Since the rubber key body 2 has a similar melting point, conventional heat sealing processes can be used.

Preferably the ink layers 111, 112, and 113 also have similar melting points so that the entire heat sealing process can be carried out in the temperature range of about 110° to 120° C. Preferably also the materials of key body and inks have similar molecular polarity for easy bonding.

The following U.S. patents are incorporated herein by reference: U.S. Pat. No. 4,464,326, issued Aug. 7, 1984 to Nishihira; and U.S. Pat. No. 4,937,408, issued Jun. 26, 1990 to Hattori et al.

The foregoing description of the specific embodiments will so fully reveal the general nature of the invention that others can, by applying current knowledge, readily modify and/or adapt for various applications such specific embodiments without undue experimentation and without departing from the generic concept, and, therefore, such adaptations and modifications should and are intended to be comprehended within the meaning and range of equivalents of the disclosed embodiments. The means and materials for carrying out various disclosed functions may take a variety of alternative forms without departing from the invention. It is to be understood that the phraseology or terminology employed herein is for the purpose of description and not of limitation.

What is claimed is:

1. A key switch for mounting within a key switch hole on a key pad device above a circuit board having a contact, the key switch comprising:

a rubber key body having a top surface;

a key cap fastened to said rubber key body at the top surface, the key cap being depressed to move said rubber key body downward in triggering the contact on the circuit board, wherein said key cap comprises a plastic convex lens having a convex top wall and a plain bottom wall;

said plain bottom wall having a light-blocking area and a light-penetrable area, said light-penetrable area being in the form of a pattern;

wherein said light-blocking area includes at least one layer of ink; and wherein said rubber key body is molded from a vulcanized rubber having a melting point between 110° C. to 120° C. and said top surface is sealed to said plain bottom wall of said key cap through a heat sealing process.

2. The key switch according to claim 1, wherein the vulcanized rubber comprises latex rubber.

3. The key switch according to claim 1, wherein the latex rubber is vulcanized with a peroxide.

4. The key switch according to claim 1, wherein the layer of ink includes a light-transmitting colored ink layer and an opaque ink layer, the colored ink layer being intermediate the plain bottom wall and the opaque ink layer.

5. The key switch according to claim 4, wherein the layer of ink is selectively removed to form the pattern.

6. The key switch according to claim 5, wherein the colored ink layer is resistant to laser light and the opaque ink layer can be ablated by laser light, such that a laser engraving process can form the pattern.

7. The key switch according to claim 6, wherein the laser engraving process employs laser light having an intensity of 140–170 W.

8. The key switch according to claim 6, wherein the opaque ink layer includes an additives selected from the group consisting of a combustion-resistant agent, a UV-resistant agent, an antioxidant, and a heat-resistant color powder.

9. The key switch according to claim 1, wherein the layer of ink includes a light-transmitting white ink layer, a colored ink layer, and an opaque ink layer;

the white ink layer being intermediate the plain bottom wall and the colored ink layer;

the colored ink layer being intermediate the white ink layer and the opaque ink layer.

10. The key switch according to claim 9, wherein the layer of ink is selectively removed to form the pattern.

11. The key switch according to claim 10, wherein the white ink layer and the colored ink layer are resistant to laser light and the opaque ink layer can be ablated by laser light, such that a laser engraving process can form the pattern.

12. The key switch according to claim 11, wherein the laser engraving process employs laser light having an intensity of 140–170 W.

13. The key switch according to claim 11, wherein the opaque ink layer includes an additives selected from the group consisting of a combustion-resistant agent, a UV-resistant agent, an antioxidant, and a heat-resistant color powder.

* * * * *